United States Patent
Liu et al.

(10) Patent No.: US 10,971,597 B2
(45) Date of Patent: Apr. 6, 2021

(54) SELF-ALIGNED BASE AND EMITTER FOR A BIPOLAR JUNCTION TRANSISTOR

(71) Applicant: GLOBALFOUNDRIES Inc., Grand Cayman (KY)

(72) Inventors: Qizhi Liu, Lexington, MA (US); Vibhor Jain, Essex Junction, VT (US); John J. Pekarik, Underhill, VT (US)

(73) Assignee: GLOBALFOUNDRIES U.S. INC., Singapore (SG)

( * ) Notice: Subject to any disclaimer, the term of this patent is extended or adjusted under 35 U.S.C. 154(b) by 0 days.

(21) Appl. No.: 16/551,061

(22) Filed: Aug. 26, 2019

(65) Prior Publication Data

US 2021/0066474 A1    Mar. 4, 2021

(51) Int. Cl.
*H01L 29/66* (2006.01)
*H01L 29/06* (2006.01)
*H01L 29/08* (2006.01)
*H01L 29/10* (2006.01)
*H01L 21/02* (2006.01)
*H01L 29/165* (2006.01)
*H01L 29/737* (2006.01)

(52) U.S. Cl.
CPC .. *H01L 29/66242* (2013.01); *H01L 21/02236* (2013.01); *H01L 21/02639* (2013.01); *H01L 29/0653* (2013.01); *H01L 29/0817* (2013.01); *H01L 29/0821* (2013.01); *H01L 29/1004* (2013.01); *H01L 29/165* (2013.01); *H01L 29/7371* (2013.01)

(58) Field of Classification Search
None
See application file for complete search history.

(56) References Cited

U.S. PATENT DOCUMENTS

| | | | |
|---|---|---|---|
| 6,586,307 B1 | 7/2003 | Kalburge et al. | |
| 6,812,107 B1 | 11/2004 | Schuegraf | |
| 7,026,666 B2 | 4/2006 | Kalnitsky et al. | |
| 7,291,536 B1 | 11/2007 | Kalburge et al. | |
| 8,536,012 B2 | 9/2013 | Camillo-Castillo et al. | |
| 8,710,500 B2 | 4/2014 | Chan et al. | |
| 2005/0001238 A1* | 1/2005 | Oue | H01L 29/7322 257/197 |
| 2013/0168820 A1* | 7/2013 | Adam | H01L 29/0649 257/565 |

* cited by examiner

*Primary Examiner* — Thien F Tran
(74) *Attorney, Agent, or Firm* — Thompson Hine LLP; Anthony Canale

(57) ABSTRACT

Device structures and fabrication methods for a bipolar junction transistor. A trench isolation region surrounds an active region that includes a collector. A base layer includes a first section and a second section that are located over the active region. An emitter is positioned on the first section of the base layer, and an extrinsic base layer is positioned on the second section of the base layer. The extrinsic base layer has a side surface adjacent to the emitter. The side surface of the extrinsic base layer is inclined relative to a top surface of the base layer in a direction away from the emitter.

17 Claims, 6 Drawing Sheets

SELF-ALIGNED BASE AND EMITTER FOR A BIPOLAR JUNCTION TRANSISTOR

BACKGROUND

The invention relates generally to semiconductor device and integrated circuit fabrication and, in particular, to device structures and fabrication methods for a bipolar junction transistor.

A bipolar junction transistor is a three-terminal electronic device that includes an emitter, a collector, and an intrinsic base arranged between the emitter and collector. In a PNP bipolar junction transistor, the emitter and collector are composed of p-type semiconductor material, and the intrinsic base is composed of n-type semiconductor material. In an NPN bipolar junction transistor, the emitter and collector are composed of n-type semiconductor material, and the intrinsic base is composed of p-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials have different energy bandgaps, which creates heterojunctions. For example, the collector and/or emitter of a heterojunction bipolar transistor may be constituted by silicon, and the intrinsic base of a heterojunction bipolar transistor may be constituted by a silicon germanium (SiGe) alloy, which is characterized by a narrower band gap than silicon.

Although existing structures have proven suitable for their intended purpose, improved structures and fabrication methods for a bipolar junction transistor are needed.

SUMMARY

In an embodiment of the invention, a device structure for a bipolar junction transistor is provided. The device structure includes a trench isolation region surrounding an active region, a collector in the active region, and a base layer including a first section and a second section that are located over the active region. An emitter is positioned on the first section of the base layer, and an extrinsic base layer is positioned on the second section of the base layer. The extrinsic base layer has a side surface adjacent to the emitter. The side surface of the extrinsic base layer is inclined relative to a top surface of the base layer in a direction away from the emitter.

In an embodiment of the invention, a method is provided of forming a device structure for a bipolar junction transistor. The method includes forming a trench isolation region in a substrate that surrounds an active region, forming a collector in the active region, forming a base layer located over the active region, forming an emitter positioned on a first section of the base layer, and forming an extrinsic base layer on a second section of the base layer. The extrinsic base layer has a side surface adjacent to the emitter. The side surface of the extrinsic base layer is inclined relative to a top surface of the base layer in a direction away from the emitter.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
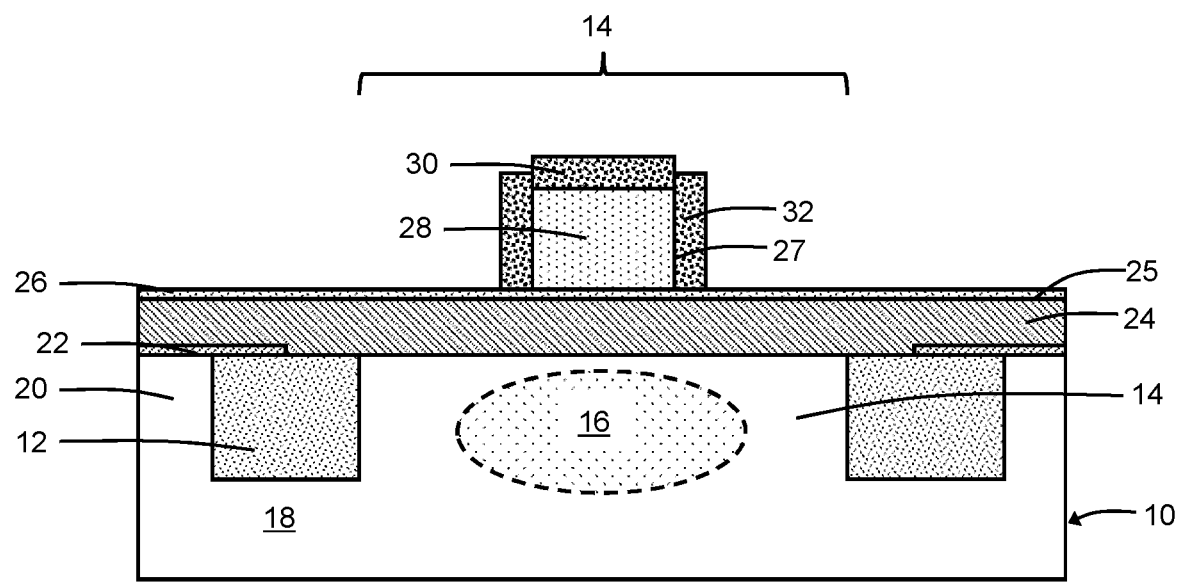
FIG. 1 is a cross-sectional view of a device structure at an initial fabrication stage of a processing method in accordance with embodiments of the invention.

With reference to FIG. 1 and in accordance with embodiments of the invention, a substrate 10 is composed of a single-crystal semiconductor material suitable for the fabrication of the device structures of an integrated circuit. The semiconductor material constituting the substrate 10 may include an epitaxial layer at its top surface, and the epitaxial layer may be doped with an electrically-active dopant to alter its electrical conductivity. For example, an epitaxial layer of single-crystal silicon may be epitaxially grown on the substrate 10 and doped with an n-type dopant from Group V of the Periodic Table (e.g., phosphorus (P) and/or arsenic (As)) to provide n-type conductivity.

A trench isolation region 12 is formed in the substrate 10 and surrounds a section of the substrate 10 to define an active region 14 composed of a portion of the semiconductor material of the substrate 10. The trench isolation region 12 may be formed by a shallow trench isolation technique that relies on a lithography and dry etching process to define trenches in the substrate 10, deposits a dielectric material to overfill the trenches, and planarizes the dielectric material using chemical mechanical polishing to remove dielectric material from the field. The dielectric material may be composed of an electrical insulator, such as silicon dioxide, deposited by chemical vapor deposition.

A collector 16 is arranged in the active region 14 and may constitute all or a portion of the active region 14. The electrical conductivity of the collector 16 may be elevated relative to the substrate 10 by, for example, selectively implanting a dopant, such as an n-type dopant, into a central portion of the active region 14. A subcollector 18 extends laterally in the substrate 10 beneath the trench isolation region 12 in order to couple the collector 16 with a collector contact region 20, which is arranged outside of the trench isolation region 12. The subcollector 18 may be formed beneath the top surface of the substrate 10 by introducing an electrically-active dopant, such as an n-type dopant (e.g., phosphorus (P), arsenic (As), and/or antimony (Sb)) to produce n-type conductivity. In one embodiment, the subcollector 18 may be formed in the substrate 10 by a masked high-current ion implantation followed by a high-temperature thermal anneal.

A protect layer 22 includes a window that provides an opening exposing the collector 16 at the top surface of the substrate 10 in the active region 14. The protect layer 22 may be composed of, for example, polysilicon.

A base layer 24 is formed over the trench isolation region 12, the active region 14, and the collector contact region 20.

The base layer 24 may be composed of a semiconductor material, such as silicon-germanium (SiGe) including silicon (Si) and germanium (Ge) combined in an alloy with the silicon content ranging from 95 atomic percent to 50 atomic percent and the germanium content ranging from 5 atomic percent to 50 atomic percent. The germanium content of the base layer 24 may be uniform, or may be graded and/or stepped across its thickness with portions that lack germanium. The base layer 24 may be doped with a concentration of a dopant, such as a p-type dopant (e.g., boron (B) and/or indium (In)) to provide p-type conductivity. The base layer 24 may be formed using an epitaxial growth process. The base layer 24 may include single-crystal semiconductor material epitaxially grown on the active region 14, and polycrystalline semiconductor material that forms on the protect layer 22.

A base dielectric layer 26 composed of, for example, silicon dioxide may be formed over the entirety of the base layer 24. A sacrificial emitter 28 is formed over the base layer 24 and over the active region 14 of the substrate 10 containing the collector 16. The sacrificial emitter 28 may be patterned using lithography and etching processes from a deposited layer of a given material, such as polysilicon. The sacrificial emitter 28 is covered by a cap 30 that may represent a remnant of a hard mask used during patterning and that may be composed of silicon nitride. A sidewall spacer 32 is formed that extends about the sidewall 27 of the sacrificial emitter 28. The sidewall spacer 32 may be composed of a dielectric material, such as silicon nitride, that is deposited as a conformal layer by atomic layer deposition and etched with a directional etching process, such as reactive ion etching. The base layer 24 may be implanted with a dopant, such as boron (B), to elevate its electrical conductivity.

Figure 2:
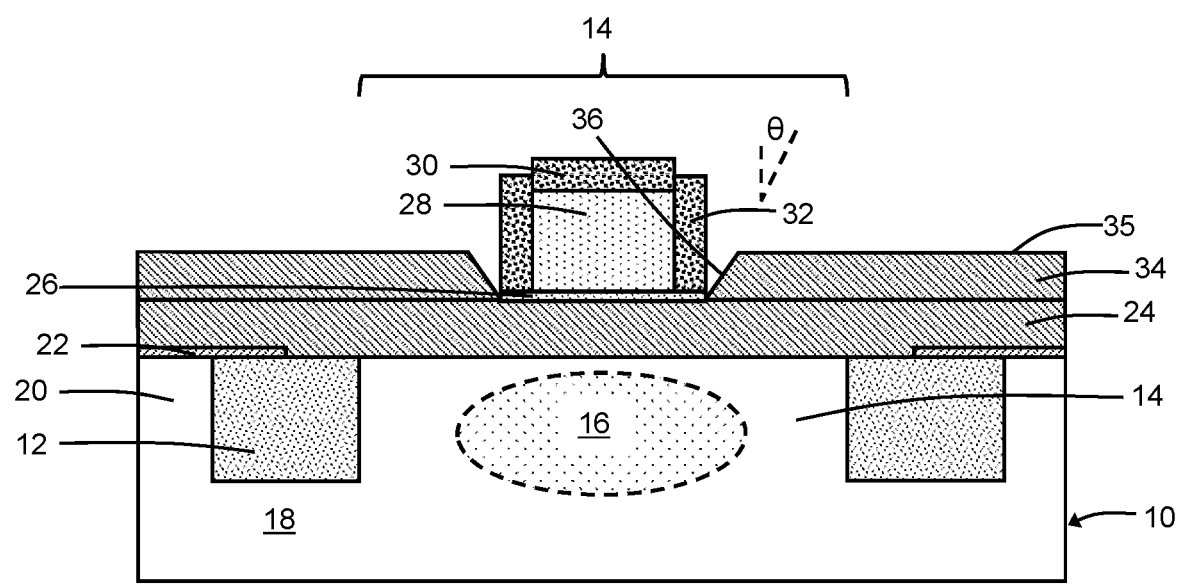
FIG. 2 is a cross-sectional view of the device structure at a fabrication stage of the processing method subsequent to FIG. 1.

With reference to FIG. 2 in which like reference numerals refer to like features in FIG. 1 and at a subsequent fabrication stage of the processing method, the base dielectric layer 26 is removed from the base layer 24 with an etching process, such as a reactive ion etching process. A section of the base dielectric layer 26 is masked by the sacrificial emitter 28 during the etching process and is thus retained between the sacrificial emitter 28 and the base layer 24.

A semiconductor layer 34 is formed on the surface of the base layer 24 over the trench isolation region 12, the active region 14 with the exception of the area covered by the spacer-clad sacrificial emitter 28, and the collector contact region 20. The semiconductor layer 34 may be composed of single-crystal semiconductor material, such as single-crystal silicon, grown by an epitaxial growth process. In an embodiment, the semiconductor layer 34 may be formed by a selective epitaxial growth (SEG) process in which semiconductor material nucleates for epitaxial growth on semiconductor surfaces such as the single-crystal substrate 10, but does not nucleate for epitaxial growth from insulator surfaces, such as the cap 30 and sidewall spacer 32 associated with the sacrificial emitter 28. The semiconductor layer 34 may be composed of a single-crystal semiconductor material, such as single-crystal silicon, and may be in situ doped during epitaxial growth with a dopant, such as a p-type dopant (e.g., boron (B)). In an embodiment, the semiconductor layer 34 may be heavily doped with boron.

The semiconductor layer 34 has a profile adjacent to the sidewall spacer 32 on the sidewall 27 of the sacrificial emitter 28. The profile of the semiconductor layer 34 includes a side surface 36 that is located adjacent to the sidewall 27 of the sacrificial emitter 28 and that is angled in a direction away from the sidewall 27 of the sacrificial emitter 28 to define a facet. In that regard, the side surface 36 may be inclined at an angle, $\theta$, relative to the surface normal to the plane containing the top surface 25 of the base layer 24. In an embodiment, the side surface 36 may be oriented in a crystallographic plane of the semiconductor material of the semiconductor layer 34.

The side surface 36 may extend over the entire thickness of the semiconductor layer 34 from a top surface 25 of the base layer 24 (i.e., the bottom surface of the semiconductor layer 34) to the top surface 35 of the semiconductor layer 34. The faceting embodied in the side surface 36 may be produced by adjusting the gas ratio and/or pressure during the epitaxial growth process. The side surface 36 is spaced from the sidewall spacer 32 with a spacing that may increase from the top surface 25 of the base layer 24 (i.e., the bottom surface of the semiconductor layer 34) to the top surface 35 of the semiconductor layer 34.

Figure 2A:
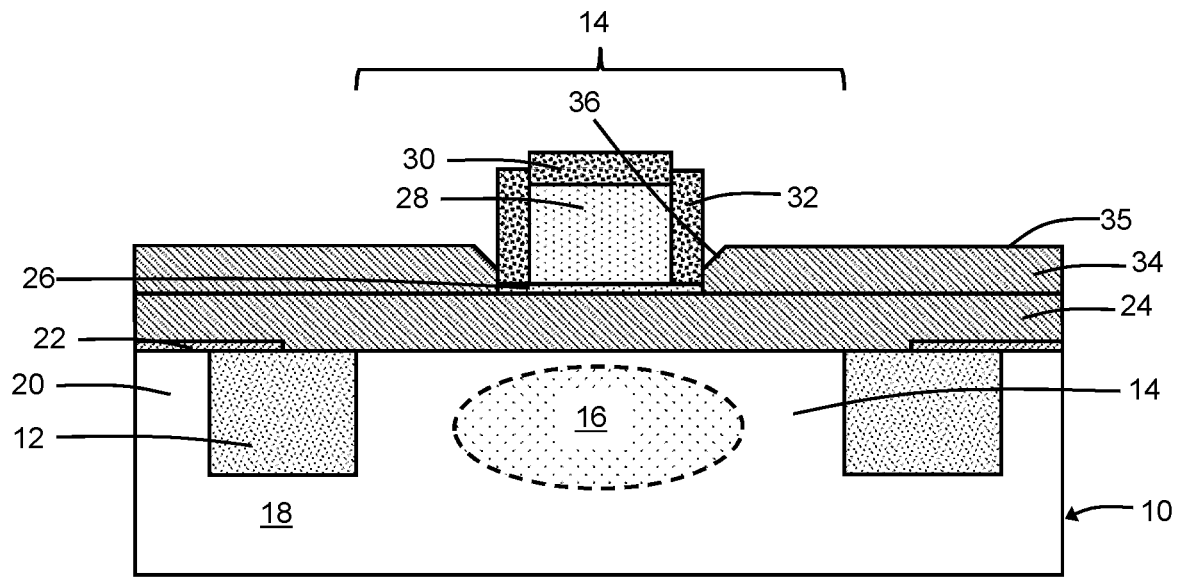
FIG. 2A is a cross-sectional view similar to FIG. 2 of a device structure in accordance with an alternative embodiment of the invention.

In an alternative embodiment and as shown in FIG. 2A, the side surface 36 of the semiconductor layer 34 may be angled only over a portion of the full thickness of the semiconductor layer 34. For example, the side surface 36 may contact the sidewall spacer 32 over a portion of its height, and the side surface 36 may be inclined over only a portion of the full thickness of the semiconductor layer 34. In another example, a portion of the side surface 36 closest to the top surface 25 of the base layer 24 may contact the sidewall spacer 32 and a portion of the side surface 36 closest to the top surface 35 of the semiconductor layer 34 may be inclined to exhibit faceting.

Figure 3:
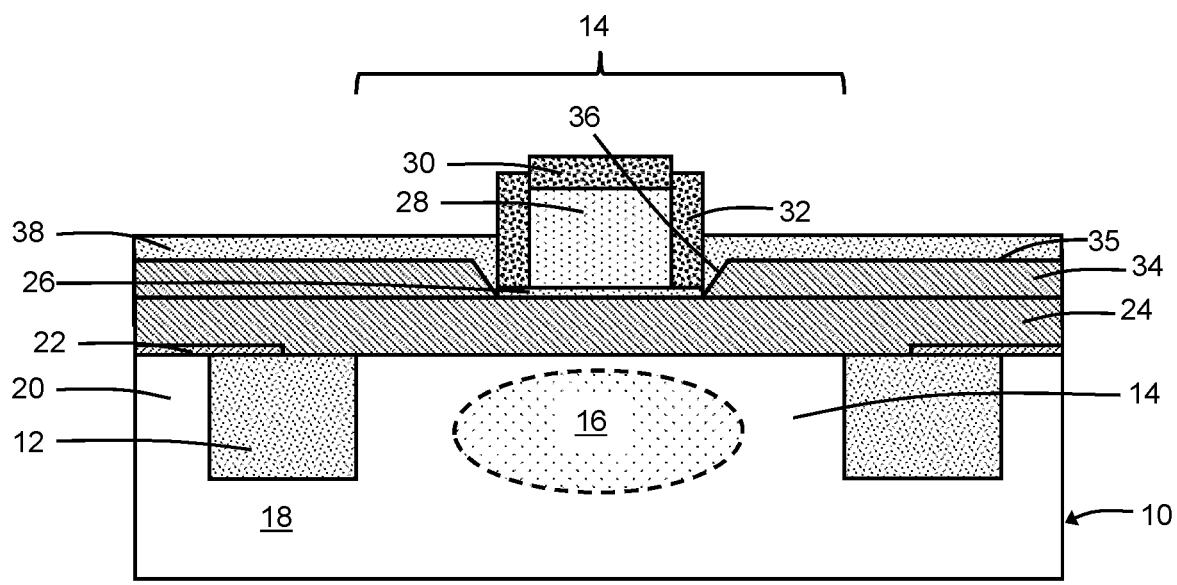
FIGS. 3-7 are cross-sectional views of the device structure at successive fabrication stages of the processing method subsequent to FIG. 2.

With reference to FIG. 3 in which like reference numerals refer to like features in FIG. 2 and at a subsequent fabrication stage of the processing method, an isolation layer 38 is formed that covers the semiconductor layer 34 including the side surface 36. The isolation layer 38 may be comprised of a dielectric material, such as silicon dioxide formed by, for example, thermal oxidation at high pressure with steam (HIPOX) that converts a thickness of the semiconductor layer 34 into oxide. The isolation layer 38 has a thickness, t, (FIG. 4) that is significantly greater than the thickness of the section of the base dielectric layer 26 beneath the sacrificial emitter 28. Because of the method in which the isolation layer 38 formed, the isolation layer 38 is located in direct contact with the semiconductor layer 34, and polishing is not required following its formation.

Figure 4:
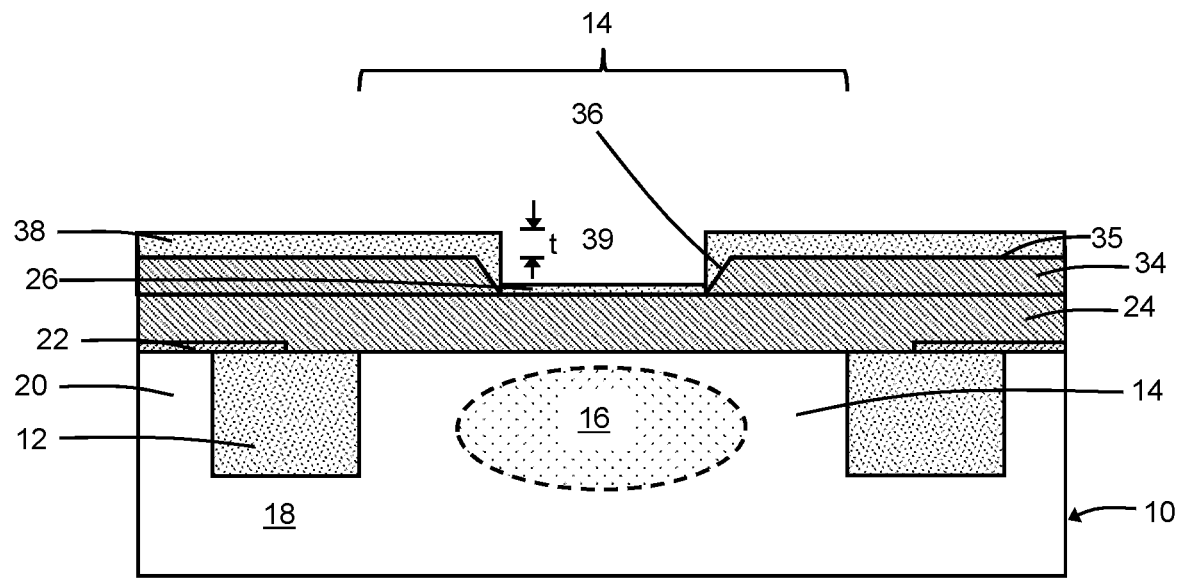

With reference to FIG. 4 in which like reference numerals refer to like features in FIG. 3 and at a subsequent fabrication stage of the processing method, the cap 30 and the sidewall spacer 32 are selectively removed from the sacrificial emitter 28, which exposes the sacrificial emitter 28. The cap 30 and the sidewall spacer 32 may be removed by an etching process selective to the material of the isolation layer 38. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process.

The sacrificial emitter 28 is then removed by an etching process. The sacrificial emitter 28 may be removed by either a wet chemical etching process or a reactive ion etching process selective to the material of the isolation layer 38. The removal of the sacrificial emitter 28 defines an opening 39 in the isolation layer 38 that exposes the section of the base dielectric layer 26.

Figure 5:
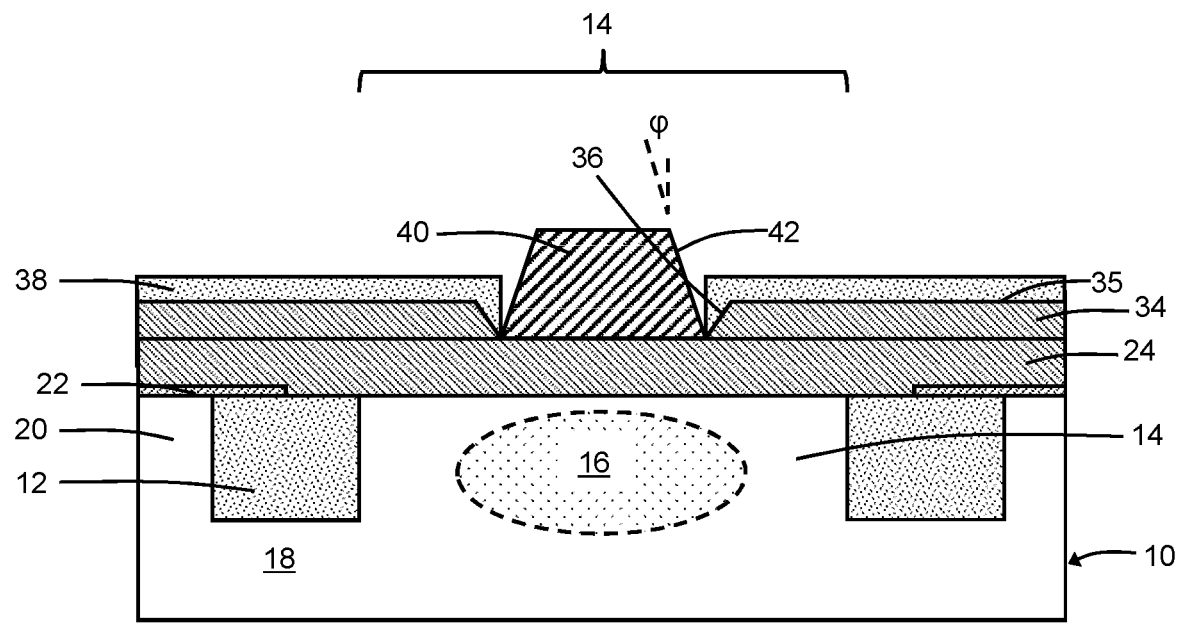

With reference to FIG. 5 in which like reference numerals refer to like features in FIG. 4 and at a subsequent fabrication stage of the processing method, the section of the base dielectric layer 26 may be removed from inside the opening 39 by an etching process. In an embodiment, the section of the base dielectric layer 26 may be removed by chemical oxide removal (COR) that removes the base dielectric layer 26 while thinning, but not removing, the isolation layer 38. Chemical oxide removal may utilize a mixture of hydrogen fluoride and ammonia, and may be performed at sub-atmospheric pressure and at approximately room temperature. The etching process may stop on the base layer 24 after penetrating through the base dielectric layer 26. The removal of the section of the base dielectric layer 26 exposes a portion of the base layer 24 that is located over the active region 14 of the substrate 10 containing the collector 16. The exposed portion of the base layer 24 is surrounded within the opening 39 (FIG. 4) by the portion of the isolation layer 38 on the side surface 36 of the semiconductor layer 34 providing the faceting.

An emitter 40 is formed inside the opening 39 on the exposed portion of the base layer 24. The emitter 40 may be composed of single-crystal semiconductor material, such as single-crystal silicon, grown by an epitaxial growth process. In an embodiment, the emitter 40 may be formed by a selective epitaxial growth (SEG) process in which semiconductor material nucleates for epitaxial growth on semiconductor surfaces such as the single-crystal substrate 10, but does not nucleate for epitaxial growth from insulator surfaces, such as the isolation layer 38. The emitter 40 may be composed of a single-crystal semiconductor material, such as single-crystal silicon, and may be in situ doped during epitaxial growth with a dopant, such as an n-type dopant (e.g., phosphorus (P) or arsenic (As)). In an embodiment, the semiconductor layer 34 may be heavily doped with the n-type dopant.

The emitter 40 has a sidewall 42 with a profile that is located adjacent to the isolation layer 38 on the side surface 36 of the base layer 24. The sidewall 42 of the emitter 40 may be angled or inclined relative to the side surface 36 of the base layer 24 in a direction away from the side surface 36 of the semiconductor layer 34 to define a facet. In that regard, the sidewall 42 of the emitter 40 may be inclined at an angle, $\varphi$, relative to the surface normal to the plane containing the top surface 25 of the base layer 24. In an embodiment, the sidewall 42 may be oriented in a crystallographic plane of the semiconductor material of the emitter 40. Complementarily, the side surface 36 of the base layer 24 is angled or inclined in a direction away from the sidewall 42 of the emitter 40.

The sidewall 42 may extend over the entire height from a top surface of the base layer 24 (i.e., the bottom surface of the emitter 40) to the top surface of the emitter 40. The faceting of the sidewall 42 may be produced by adjusting the gas ratio and/or pressure during the epitaxial growth process. The sidewall 42 is spaced from the isolation layer 38 on the side surface 36 of the base layer 24 with a spacing that may increase from the top surface of the base layer 24 (i.e., the bottom surface of the semiconductor layer 34) to the top surface of the emitter 40. The spacing of the sidewall 42 relative to the isolation layer 38 on the side surface 36 of the base layer 24 defines a crevice or gap providing separation, and the side surface 36 and the sidewall 42 diverge in opposite directions away from each other on opposite sides of the gap. The gap, which is subsequently filled with dielectric material, may operate to reduce the emitter-base capacitance during device operation.

Figure 6:
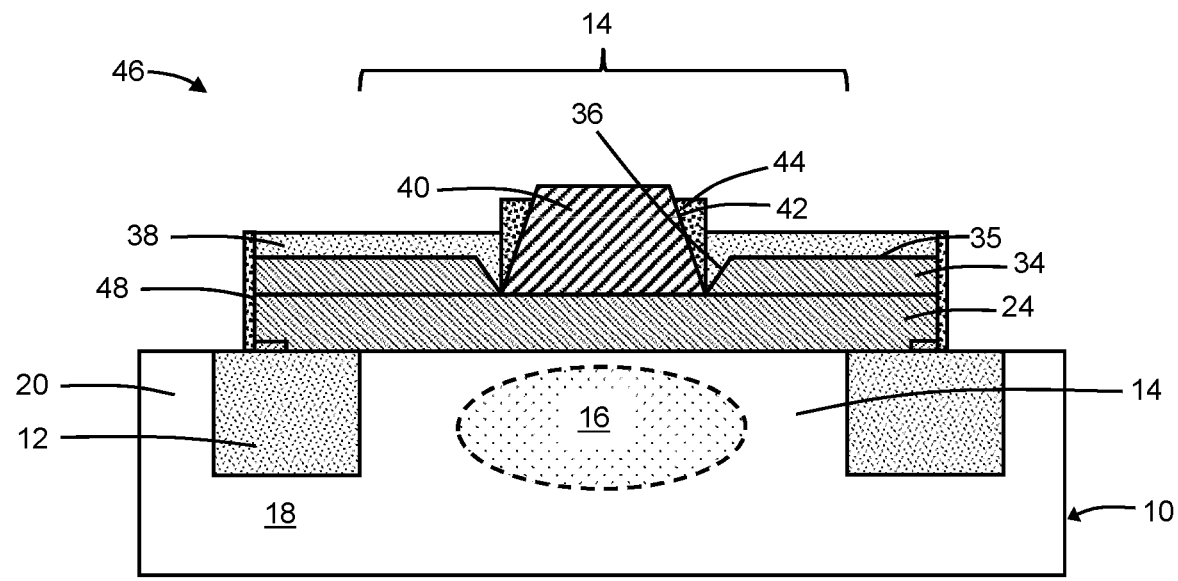

With reference to FIG. 6 in which like reference numerals refer to like features in FIG. 5 and at a subsequent fabrication stage of the processing method, a spacer 44 may be formed in the gap between the sidewall 42 of the emitter 40 and to the isolation layer 38 on the side surface 36 of the base layer 24. The spacer 44 may be composed of a dielectric material, such as silicon nitride, that is deposited as a conformal layer by atomic layer deposition and etched with a directional etching process, such as reactive ion etching. In an alternative embodiment, the spacer 44 may be omitted.

A device structure 46 for a bipolar junction transistor is defined by photolithography and etching processes. The formation of the device structure 46 shapes the device structure 46 and exposes the collector contact region 20. A sidewall spacer 48 may be formed that surrounds the outer side edges of the device structure 46. The sidewall spacer 48 may be composed of a dielectric material, such as silicon nitride, that is deposited as a conformal layer by atomic layer deposition and etched with a directional etching process, such as reactive ion etching.

The device structure 46 has a vertical architecture that includes the collector 16, the emitter 40, and an intrinsic base provided by the portion of the base layer 24 that is arranged between the emitter 40 and collector 16. A junction is located between the emitter 40 and the base layer 24, and another junction is located between the base layer 24 and the collector 16. The device structure 46 may be considered a heterojunction bipolar transistor if, for example, the base layer 24 is composed of silicon-germanium. The device structure 46 can be divided into an intrinsic region that includes the junctions, and an extrinsic region that is peripherally arranged outside of the intrinsic region. The semiconductor layer 34 that provides an extrinsic base of the device structure 46 that is directly coupled to the base layer 24 and that is used to contact the base layer 24.

Figure 7:
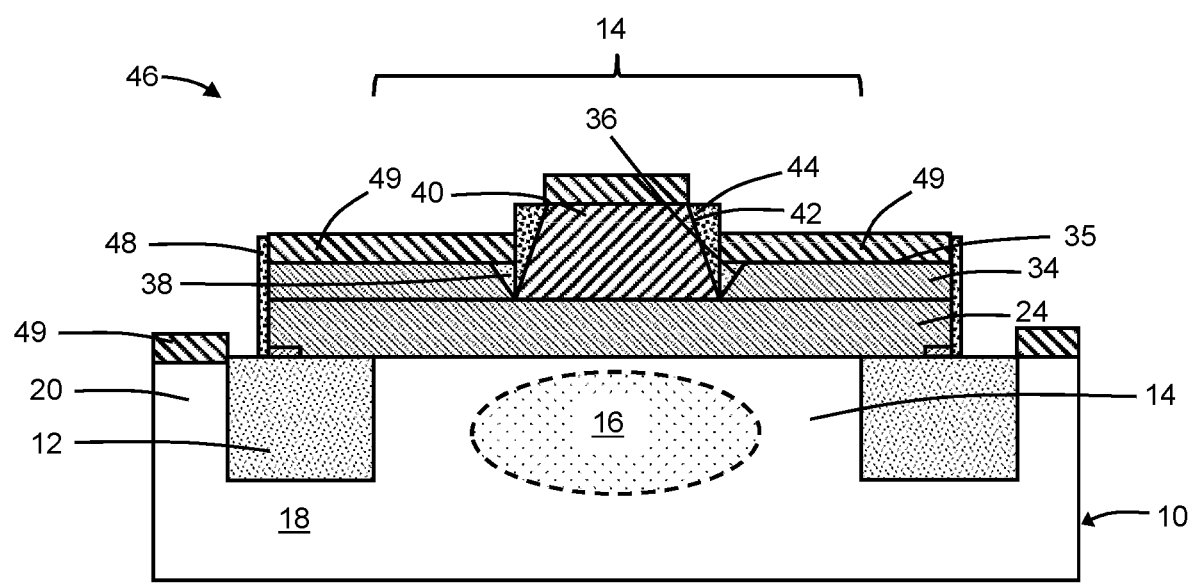

With reference to FIG. 7 in which like reference numerals refer to like features in FIG. 6 and at a subsequent fabrication stage of the processing method, the isolation layer 38 may be removed from the top surface 35 of the semiconductor layer 34 while retaining a portion of the isolation layer 38 in the gap between the side surface 36 of the semiconductor layer 34 and the sidewall 42 of the emitter 40. The isolation layer 38 may be removed from the top surface 35 with an etching process, such as reactive ion etching. Sections of a silicide layer 49 may be formed on the collector contact region 20, the top surface 35 of the semiconductor layer 34, and the emitter 40.

Middle-of-line processing and back-end-of-line processing follow, which includes formation of contacts, vias, and wiring for an interconnect structure that is coupled with the device structure 46.

Figure 8:
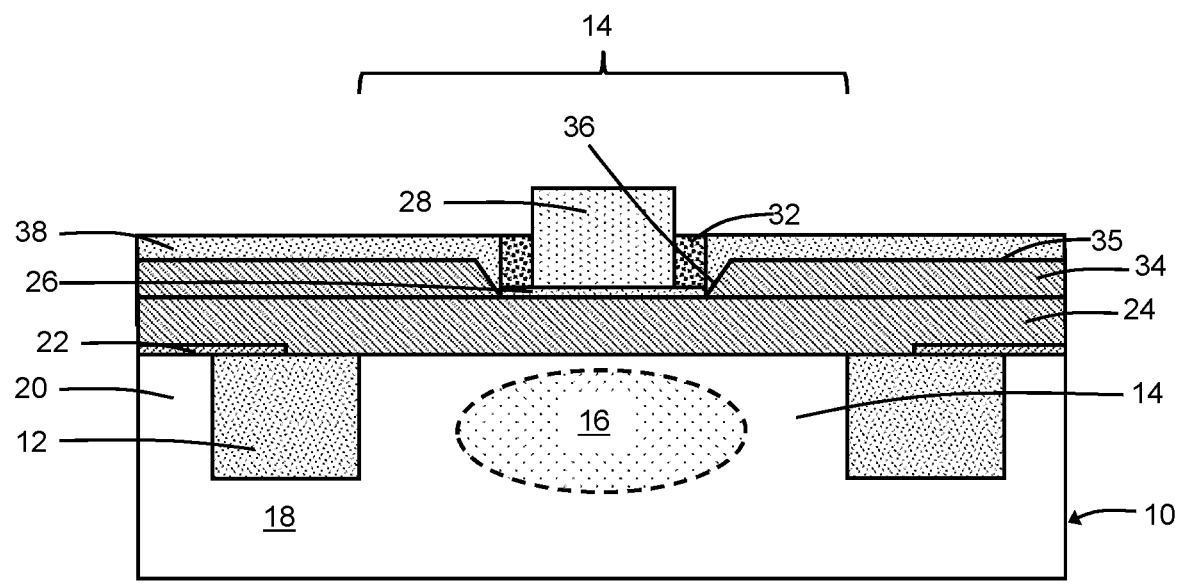
FIGS. 8-10 are cross-sectional views of a device structure at successive fabrication stages of a processing method in accordance with alternative embodiments of the invention.

With reference to FIG. 8 in which like reference numerals refer to like features in FIG. 2 and in accordance with alternative embodiments, the semiconductor layer 34 may be epitaxially grown, as previously described, such that the side surface 36 is in contact with the sidewall spacer 32 over its full height. The isolation layer 38 is then formed, as previously described, that covers the semiconductor layer 34. After forming the isolation layer 38, the cap 30 is removed from the sacrificial emitter 28, and the sidewall spacer 32 is recessed, but not removed, with an etching process.

Figure 9:
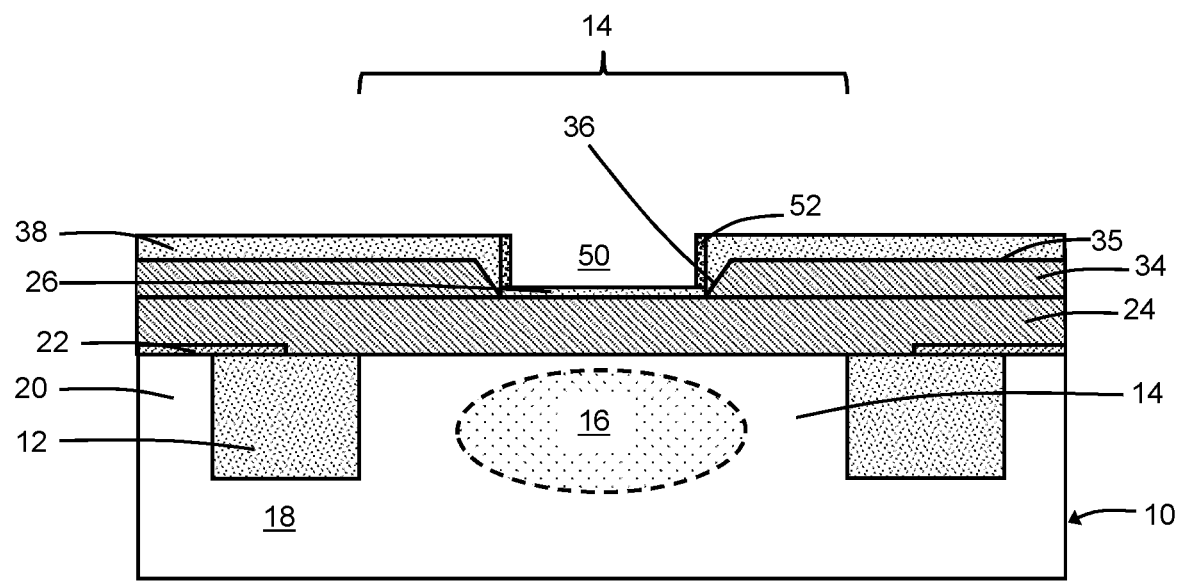

With reference to FIG. 9 in which like reference numerals refer to like features in FIG. 8 and at a subsequent fabrication stage of the processing method, the sacrificial emitter 28 is removed as previously described to form an opening 50 extending to the base layer 24. The sidewall spacer 32 is then removed with an etching process. A sidewall spacer 52 is formed inside the opening 50 on the sidewalls of the semiconductor layer 34. The sidewall spacer 52 may be composed of polysilicon that is deposited as a conformal layer and etched by an anisotropic etching process, such as reactive ion etching. In an alternative embodiment, the sidewall spacer 32 may be retained and is disposed between the sidewall spacer 52 and the semiconductor layer 34.

Figure 10:
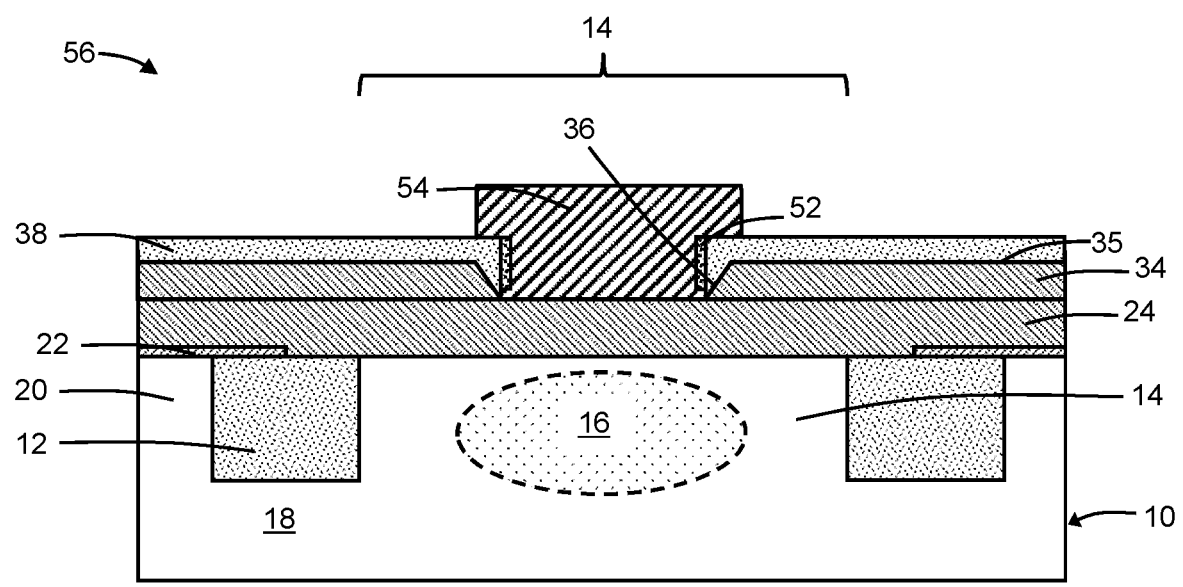

With reference to FIG. 10 in which like reference numerals refer to like features in FIG. 9 and at a subsequent fabrication stage of the processing method, the opening 50 is extended through the base dielectric layer 26 using an etching process to expose the portion of the base layer 24 over the collector 16 in the active region 14. An emitter 54 is patterned by lithography and etching processes from a layer of a conductor, such as doped polysilicon, that is deposited over the isolation layer 38. Processing continues to shape a device structure 56 and apply the sidewall spacer 48 extending about the outer perimeter of the device structure 56.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor, the device structure comprising:
   a trench isolation region surrounding an active region;
   a collector in the active region;
   a base layer including a first portion and a second portion that are located over the active region, the base layer having a top surface;
   an emitter positioned on the first portion of the base layer, the emitter having a sidewall;
   an extrinsic base layer on the second portion of the base layer, the extrinsic base layer having a thickness, the extrinsic base layer having a side surface adjacent to the emitter, and the side surface of the extrinsic base layer spaced from the sidewall of the emitter by a gap; and
   a spacer in the gap between the sidewall of the emitter and the side surface of the extrinsic base layer,
   wherein the side surface is inclined over a first portion of the thickness relative to the top surface of the base layer in a first direction away from the emitter and is in contact with the spacer over a second portion of the thickness.

2. The device structure of claim 1 wherein the sidewall of the emitter is inclined relative to the top surface of the base layer in a second direction away from the side surface of the extrinsic base layer.

3. The device structure of claim 1 further comprising:
   an isolation layer including a portion positioned in the gap on the side surface of the extrinsic base layer.

4. The device structure of claim 3 wherein the spacer is positioned in the gap between the sidewall of the emitter and the portion of the isolation layer on the side surface of the extrinsic base layer.

5. The device structure of claim 3 wherein the portion of the isolation layer is positioned in direct contact with the side surface of the extrinsic base layer.

6. A method of forming a device structure for a bipolar junction transistor, the method comprising:
   forming a trench isolation region in a substrate that surrounds an active region;
   forming a collector in the active region;
   forming a base layer located over the active region;
   forming a first emitter positioned on a first portion of the base layer;
   forming an extrinsic base layer on a second portion of the base layer, the extrinsic base layer having a side surface adjacent to the first emitter, and the side surface inclined relative to a top surface of the base layer in a first direction away from the first emitter; and
   oxidizing a partial thickness of the extrinsic base layer to form an isolation layer on the extrinsic base layer,
   wherein the first emitter has a sidewall, the side surface of the extrinsic base layer is spaced from the sidewall of the first emitter by a gap, and the isolation layer includes a portion positioned in the gap on the side surface of the extrinsic base layer.

7. The method of claim 6 further comprising:
   after oxidizing the partial thickness of the extrinsic base layer, forming a spacer between the sidewall of the first emitter and the portion of the isolation layer on the side surface of the extrinsic base layer.

8. The method of claim 6 wherein the sidewall of the first emitter is surrounded by a sidewall spacer, and further comprising:
   removing the first emitter and the sidewall spacer from the first portion of the base layer to define an opening surrounded by the extrinsic base layer; and
   depositing a semiconductor layer inside the opening to form a second emitter.

9. The method of claim 8 wherein the isolation layer is formed on the extrinsic base layer after removing the first emitter and the sidewall spacer from the first portion of the base layer.

10. The method of claim 6 further comprising:
removing the first emitter from the first portion of the base layer to define an opening surrounded by the extrinsic base layer; and
epitaxially growing a semiconductor layer inside the opening to form a second emitter.

11. The method of claim 10 wherein the second emitter has a sidewall, the side surface of the extrinsic base layer is spaced from the sidewall of the second emitter by a gap, and the sidewall of the second emitter is inclined relative to the top surface of the base layer in a second direction away from the side surface of the extrinsic base layer.

12. A method of forming a device structure for a bipolar junction transistor, the method comprising:
forming a trench isolation region in a substrate that surrounds an active region;
forming a collector in the active region;
forming a base layer located over the active region;
forming a first emitter positioned on a first portion of the base layer;
forming an extrinsic base layer on a second portion of the base layer, the extrinsic base layer having a side surface adjacent to the first emitter, and the side surface inclined relative to a top surface of the base layer in a first direction away from the first emitter;
removing the first emitter from the first portion of the base layer to define an opening surrounded by the extrinsic base layer; and
epitaxially growing a semiconductor layer inside the opening to form a second emitter,
wherein the second emitter has a sidewall, the side surface of the extrinsic base layer is spaced from the sidewall of the second emitter by a gap, and the sidewall of the second emitter is inclined relative to the top surface of the base layer in a second direction away from the side surface of the extrinsic base layer.

13. The method of claim 12 further comprising:
oxidizing a partial thickness of the extrinsic base layer to form an isolation layer on the extrinsic base layer.

14. The method of claim 13 wherein the isolation layer is formed on the extrinsic base layer before removing the first emitter.

15. The method of claim 13 wherein the first emitter is located on a dielectric layer positioned between the first emitter and the first portion of the base layer, and further comprising:
removing the dielectric layer to expose the first portion of the base layer.

16. The method of claim 15 wherein the isolation layer is thicker than the dielectric layer, and the dielectric layer is removed by chemical oxide removal.

17. The method of claim 12 wherein the second emitter is formed by a selective epitaxial growth process.

* * * * *